United States Patent [19]

Milberger et al.

[11] Patent Number: 4,939,450
[45] Date of Patent: Jul. 3, 1990

[54] PRECISION HIGH VOLTAGE FET PULSE SENSE AND CLAMP APPARATUS STATEMENT OF GOVERNMENT INTEREST

[75] Inventors: Walter E. Milberger, Severna Park; Franklin B. Jones, Catonsville; Charles S. Kerfoot, Pasadena, all of Md.

[73] Assignee: The United States of America as represented by the Secretary of the Air Force, Washington, D.C.

[21] Appl. No.: 324,841

[22] Filed: Mar. 17, 1989

[51] Int. Cl.⁵ .................. G01R 19/22; G01R 1/36
[52] U.S. Cl. ............................ 324/119; 307/318; 324/110; 324/121 R
[58] Field of Search ............... 324/119, 110, 121 R; 307/318

[56] References Cited

U.S. PATENT DOCUMENTS

| | | | |
|---|---|---|---|
| 2,777,956 | 1/1957 | Kretzmer | 307/318 |
| 3,008,084 | 11/1961 | Cotton | 307/318 |
| 3,536,998 | 10/1970 | Nordholm | 324/110 |
| 3,624,502 | 11/1971 | Bunker | 324/119 |
| 4,523,161 | 6/1985 | Miles | 333/81 R |
| 4,567,388 | 1/1986 | Jarrett et al. | 307/540 |
| 4,626,715 | 12/1986 | Ishii | 307/585 |

Primary Examiner—Ernest F. Karlsen
Attorney, Agent, or Firm—William G. Auton; Donald J. Singer

[57] ABSTRACT

A high voltage pulse regulator which is capable of measuring and correcting voltage perturbations on the top of a high voltage square wave pulse is disclosed. The regulator uses: a rectifying diode, an oscilloscope, a variable zener diode, a variable biasing current source and pulse capacitor. The rectifying diode receives and rectifies the high voltage square wave pulse from a high voltage pulse source to produce a rectified square wave pulse. The rectified square wave pulse is received and regulated to a voltage level acceptable to the oscilloscope by the variable zener diode pulse capacitor, and current source, which are connected together in a parallel circuit and act as follows. The variable zener diode is activated by the biasing current. Therefore, when there is no biasing current, the pulse capacitor and rectifying diode act as a peak detector, and the high voltage square wave pulse is adjusted down within a threshold of detection by the oscilloscope, when a bias current is applied to the variable zener diode, a threshold detector is established which permits the top of the pulse to be viewed on the oscilloscope display.

6 Claims, 3 Drawing Sheets

PRECISION HIGH VOLTAGE FET PULSE SENSE AND CLAMP APPARATUS STATEMENT OF GOVERNMENT INTEREST

The invention described herein may be manufactured and used by or for the Government for governmental purposes without the payment of any royalty thereon.

BACKGROUND OF THE INVENTION

The present invention relates generally to high voltage power supply systems, and more specifically to a high voltage pulse detector capable of measuring pulse top voltage perturbations more than 100 dB down from the pulse height.

Phased array radar and communication systems have transmitters that modulate high voltage (0.1 to 30 KV) pulses to emit electromagnetic radio frequency (RF) signals. Needless to say, the quality of these high voltage pulses is important to the users of these systems, but the measurement of voltage perturbations on the top of high voltage pulses has some inherent difficulties.

The previous methods of measuring voltage perturbations on the top of transmitter modulator high voltage pulses is as follows. In the past, inter modulation products attributed to transmitter modulator pulse amplitude variations were detected in the RF spectrum after the transmitter was designed. This was particularly true when spurious content was required to be down more than one hundred dB. Pulse instrumentation was limited to the use of high voltage probes or voltage dividers. The Tektronix Oscilloscope type Z differential comparator head provided viewing windows in the millivolt range. Later the type Z plug-in was superseded by the type 7A13 differential head used with the Tektronix 7000 Series Scope. The new wideband head provides a resolution of one millivolt for 10 volt pulses and 10 and 100 millivolts, respectively, when ten-to-one or one-hundred to one probes are used.

The storage scope facility (the oscilloscope combined with voltage dividers) provides an excellent basis for pulse top amplitude measurement. The accuracy, however, is limited by the calibration of the resistor divider or step-down probe which are required for voltages in excess to 40 volts. When high-level pulses are measured, induced voltages resulting from radiation often distorts the waveform viewed. Radiation entering through the scope shield can be controlled by moving the scope to a remote location. Radiation introduced in the probe or voltage dividers, however, cannot be suppressed without lowering the source impedance.

In view of the foregoing discussion it is apparent that there remains a need to provide a new means for precision measurement of measuring voltage perturbations on the top of high voltage (0.1 to 30 KV) pulses. The present invention is intended to satisfy that need.

SUMMARY OF THE INVENTION

The present invention includes a means of measuring voltage perturbations on the top of transmitter modulator high voltage pulses. More specifically, the invention permits the measurement of voltage variations more than one hundred dB down from the pulse height on the top of square wave pulses of 0.1 to 30 KV pulses using: a rectifying diode, a zener diode in parallel with a capacitor, a bias current source, sensing resistors, and an oscilloscope.

The embodiment of the invention, as described above, functions as a basic threshold detector circuit as follows. The rectifying diode produces an output signal by receiving and rectifying the high voltage square wave pulse from a transmitter modulator. The zener diode and capacitor are in a parallel circuit with each other and receive the rectified pulse from the rectifying diode. The zener diode has a reverse bias with respect to the rectified pulse, and is activated by a bias current. This allows the rectifying diode and capacitor to act as a peak detector (when the zener diode receives no bias current from the current source); and as a threshold detector when it receives a bias current. The reason for this is because the zener diode is designed to undergo an abrupt avalanche breakdown at a predictable reverse bias voltage. Therefore, once the rectified pulse exceeds the predictable reverse bias voltage, the zener diode and capacitor output a detection signal.

The zener diode and capacitor are connected to a common electrical ground by the sensing resistors, which are in a parallel circuit with the oscilloscope. This allows the oscilloscope to receive the detection signals from the zener diode and capacitor, which operate as a detector as described above. This also allows the oscilloscope to view the perturbations on top of the high voltage square wave pulse, since the only signal that gets past the zener diode is the signal that is above the predictable reverse bias voltage at which the avalanche breakdown occurs.

As described above, the zener diode circuit is also capable of operating as a threshold detector circuit when it is connected with a variable biasing current source. The biasing current is variable, and activates the variable zener diode to adjustably cause the zener diode to approach avalanche breakdown. The avalanche breakdown is a nondestructive breakdown of the reverse biased p.n junction in the zener diode due to the heavy current of the rectified pulse and the biasing current. Additionally, the variable zener diode is used to vary the predictable reverse bias voltage at which the avalanche occurs.

Another embodiment of the invention includes a means of measuring voltage perturbations on the top of transmitter high voltage pulses as well as a circuit for clamping these pulses. This embodiment includes a pulse measuring circuit composed of a first field effect transistor (FET) which is used as a tapped voltage regulator, and a second FET used as a continuously variable shunt regulator to establish the detector's threshold reference. Three zener diodes are used in the gate and drain circuits of the first FET to provide 200–800 volt taps. In the second FET two zener diodes are used in the gate and source circuits to provide continuously variable shunt regulation. The FET's are connected in a voltage divider configuration having a sensing resistance to ground, and to reduce the voltage of the pulse down to a level at which it may be measured by an oscilloscope.

Like the first embodiment, the second embodiment uses a commercially-available oscilloscope, such as the Tektronix 7000 series scope as the measuring and display device. When connected in parallel with the sensing resistance, the top of the pulse appears on the scope display. When a pulse capacitor is used in place of the sensing resistor, an R-C filter is formed to filter out any voltage perturbations from the top of the pulse, and a corrected square wave is displayed and measured on the oscilloscope.

The final embodiment of the invention is an automatic pulse regulator, which receives and corrects perturbations on the top of high voltage square wave pulses from sources such as transmitter modulators. The automatic pulse regulator circuit should be electrically connected in a parallel circuit between the high voltage pulse source, such as travelling wave tube (TWT), and the load. The automatic pulse regulation circuit includes: an input resistance, a rectifying diode, and a regulator circuit which is connected to a common electrical ground. This regulation circuit included a variable zener diode which is connected in a parallel circuit with a pulse capacitor and a biasing current source. This system acts as a pulse clamp regulator, as the pulse capacitor shunts the regulator to reduce the high peak pulse clipping of the TWT pulse into a low average value. This corrects the perturbations otherwise found on the top of the received high voltage square wave pulses.

It is an object of the present invention to permit accurate measurement and viewing of perturbations which appear on the top of high voltage square wave pulses.

It is another object of the present invention to improve the pulses produced by transmitter modulators by clamping undesired perturbations which appear on the top of the pulses.

It is another object of the present invention to improve the pulses produced by transmitter modulators by clamping undesired perturbations which appear on the top of the pulses.

These objects together with other objects, features and advantages of the invention will become more readily apparent from the following detailed description when taken in conjunction with the accompanying drawings wherein like elements are given like reference numerals throughout.

DETAILED DESCRIPTION OF THE PREFERRED EMBODIMENT

The present invention is a precision high voltage pulse sense and clamp apparatus.

Figure 1:
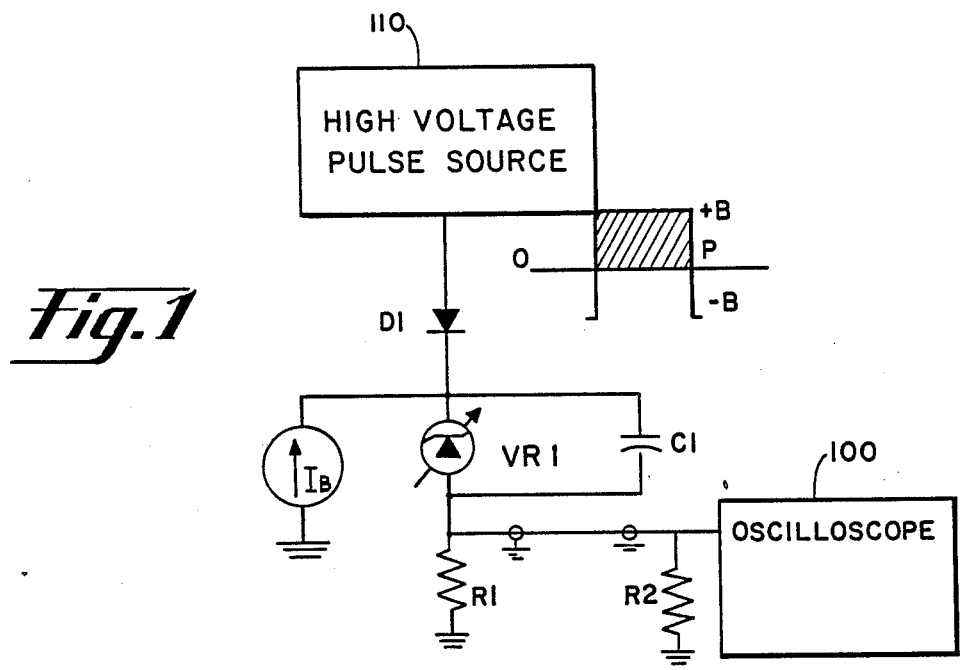
FIG. 1 is an electrical schematic of an embodiment of the invention used as a detection circuit.

The reader's attention is now directed toward FIG. 1, which is an electrical schematic of the basic threshold detector system. This system permits a commercially-available oscilloscope 100 to measure and display the perturbations appearing on the top of a high voltage (0.1 to 30 KV) square wave pulse produced by a high voltage transmitter modulator 110 using: a rectifying diode D1, a variable zener diode VR1 in parallel with a capacitor C1, a variable bias current source $I_B$, and sensing resistors R1 and R2.

The system of FIG. 1 functions as a basic threshold detector circuit as follows. The transmitter modulator produces the high voltage square wave pulse which has the amplitude depicted in FIG. 1 as "B." As mentioned above, such transmitter modulators are typically used with the travelling wave tubes of the transmitters of phased array radar systems and communicator systems, and typical voltage levels range between 0.1 and 30 KV.

The rectifying diode D1 is electrically connected with the transmitter modulator 110, and produces a rectified square wave pulse by rectifying all signals received therefrom. The zener diode VR1 and capacitor C1 are in a parallel circuit with each other and receive the rectified pulse from the rectifying diode D1. As depicted in FIG. 1, the zener diode has a reverse bias with respect to the rectified pulse, and this allows the rectifying diode D1 and the capacitor C1 to act as a peak detector (when the zener diode VR1 receives no bias current from the current source); and as a threshold detector when receiving a bias current. The reason for this is because the zener diode is activated by the bias current, and is designed to undergo an abrupt avalanche breakdown at a predictable reverse bias voltage. Therefore, once the rectified pulse exceeds the predictable reverse bias voltage, the zener diode and capacitor output a detection signal for voltages that exceed the reverse bias voltage level of the zener diode. When this reverse bias voltage level exactly equals the desired voltage level "B" of the square wave pulse, the detection signal indicates the presence of voltage perturbations on top of the square ease pulse produced by the transmitter modulator 110.

As described above, the zener diode circuit is also capable of operating as a threshold detector circuit, when it is connected with a variable biasing current source IB. The biasing current is variable, and activates the variable zener diode VR1 to adjustably cause the zener diode to approach avalanche breakdown. The avalanche breakdown is a nondestructive breakdown of the reverse biased p-n junction in the zener diode due to the heavy current of the rectified pulse and the biasing current. Additionally, the variable zener diode is used to vary the predictable reverse bias voltage at which the avalanche occurs.

The zener diode VR1 and capacitor C1 are connected to a common electrical ground by the sensing resistors R1 and R2, which are in a parallel circuit with the oscilloscope 100. This allows the oscilloscope to receive the detection signals from the zener diode and capacitor, which operate as a detector as described above. This also allows the oscilloscope to view the perturbations on top of the high voltage square wave pulse, since the only signal that gets past the zener diode is the signal that is above the predictable reverse bias voltage at which the avalanche breakdown occurs. The sensing resistors, when omitted, allow the pulse capacitor to shunt the regulator and reduce the peak pulse clipping and reduce the perturbations on the top of the square wave pulse. In FIG. 1, the sensing resistors are present so that the system may be used to test and measure the performance of the transmitted modulator 110.

Typical values for the pulse capacitor C1 and the sensing resistors R1 and R2 of FIG. 1 are as follows:

R1 equals 2K ohms;
R2 equals 2K ohms; and
C1 equals 1 microfarad.

Figure 2:
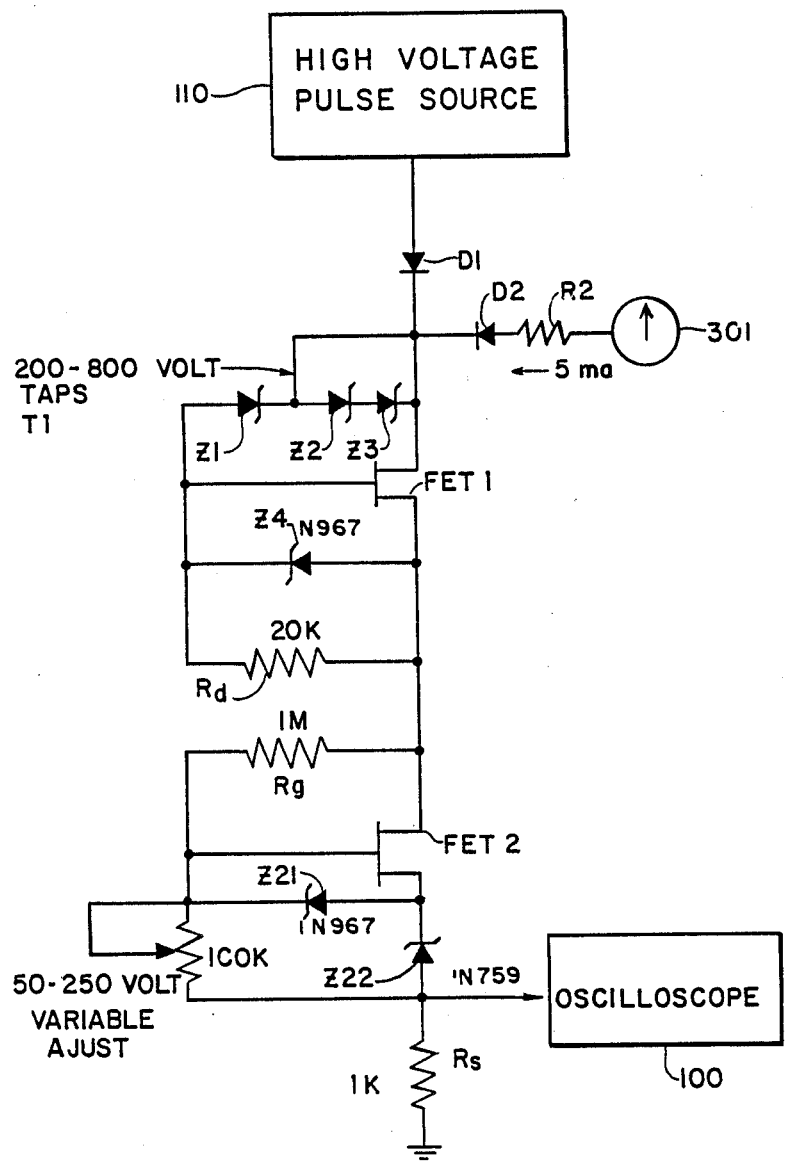
FIG. 2 is an electrical schematic of an embodiment of the invention which uses two field effect transistor circuits to measure pulse top voltage variations of high voltage square wave pulses.

The reader's attention is now directed towards FIG. 2, which is an electrical schematic of an embodiment of the invention which is a means of measuring voltage perturbations on the top of transmitter high voltage pulses as well as a circuit for clamping these pulses. This embodiment includes: a pulse measuring circuit composed of a first field transistor (FET1) which is used as a tapped voltage regulator, and a second FET used as a continuously variable shunt regulator to establish the detector's threshold reference. Three zener diodes are used in the gate and source circuits of the first FET to provide 200-800 volt taps. In other words, the tap T1 may be connected to any of the nodes between the three zener diodes Z1-Z3 to adjust the detector's threshold reference to a range of between 200 and 800 volts. For example, if the tap T1 were connected to the node N1 to the left of zener diode Z1, the detector threshold reference applied to the gate of FET1 would be 800 volts. If the tap T1 were connected to node N2, to the right of zener diode Z3, the reference threshold applied to the gate of FET1 would be 200 volts. The first field effect transistor FET1 is a commercially-available GMTP2N90 transistor, which acts as a switch. The presence of the rectified high voltage square wave from diode D1 causes the transistor to alternate from a very low impedance state (saturation) and a very high impedance state (cutoff). In this manner the first transistor circuit acts as a detector circuit in much the same manner as the system of FIG. 1: it is a tapped shunt regulator circuit which uses a current source and voltage taps to set the detection threshold. Like the detector system of FIG. 1, the detector circuit of the first FET circuit produces a detection signal on its source electrode when receiving a rectified pulse from the rectifying diode D1 on the drain terminal of FET1. This detection signal is further processed by the second field effect transistor FET2, which acts as a variable shunt regulator, as described below.

The second field effect transistor FET2 established a variable threshold reference to adjust the level of the detection signal viewed by the oscilloscope 100 using: a 1M gate resistor Rg, a 100K potentiometer, two zener diodes Z21 and Z22, a sensing resistor RS, and the second field effect transistor FET2. FET2 is a commercially-available MTP2N90 transistor which receives the detection signal over its drain and gate terminals, and which has a large gate resistor Rg to attenuate the detection signal over its gate terminal. The purpose of this second FET is to provide sufficient gain to the detection signal to compensate for the impedances of this regulator circuit while allowing the level of the detection signal to be varied by the potentiometer. Therefore, FET2 outputs an amplified detection signal out its source terminal. The amplified detection signal is conducted by the first zener diode (which is forward biased with respect to the signal) to the 100K potentiometer.

The 100K potentiometer is a 100K ohm resistor with a variable tap that can be moved along it in a manner that allows it to vary its output voltage. In FIG. 2, the potentiometer is designed to vary its output between 50 and 250 volts. This varies the voltage amplitude of the detection signal seen by the oscilloscope 100, so that the detection signal is within the detectable range of the oscilloscope.

The oscilloscope 100 of FIG. 2 may be any commercially-available oscilloscope just like the oscilloscope 100 of FIG. 1. Such systems have a threshold of detection which includes a minimum voltage threshold level which pulses received by the oscilloscope must reach in order for the oscilloscope to measure and display them.

The source terminal of FET2 is also electrically connected to the sensing resistor by the second zener diode Z22. Note that the second zener diode in this regulator circuit is reversed biased against the amplified pulse produced by FET2. This obstructs the amplfied pulse from reaching the oscilloscope unless the amplified detection signal exceeds the reverse bias voltage and causes the avalanche breakdown, as discussed above.

The operation of the system of FIG. 2 can be easily ascertained by any person of ordinary skill in the art. For others, the following explanation is given. The circuit shown in FIG. 2 is designed to measure pulse top voltage variations for pulse amplitudes up to 100 volts. Both tapped (VR1) and continuously variable (VR2) shunt regulators are used to establish the detector's threshold reference. FET's are used as pass transistors to enhance the regulator response. When used in combination with zener diodes, the high voltage pulse clipping time is comparable to that of low voltage zener diodes.

A five milliampere bias current is supplied to the network to establish a stable reference beyond the zener knee. The five volt drop developed across the 1K sense resistor Rs is balanced out by the gain provided by the differential comparator amplifier. If the current source is not well regulated and filtered, it is necessary to use a sample hold circuit to balance out long term variations of the bias current.

The pulse voltage appearing across the 1K sense resistor is the differential between the pulse height and the detector d-c reference voltage. For a pulse loading of 100 microamperes a 100 millivolt pulse would appear. This pulse loading level would not effect the operating point of the shunt regulators since the bias-to-signal current ratio is 50:1. The adjustment on the variable regulator VR2 can be set to attain a differential pulse voltage of 10 millivolts or less. At this sensitivity, pulse variations of less than one millivolt can be viewed. This corresponds to 100 dB down for 1 KV pulse.

The first FET circuit performs as a standard shunt regulator whose reference is derived from zeners Z1-Z3 bridging the drain to gate of a high voltage FET. A gate to source resistor Rd is used to establish the operational point of the zeners Z1-Z3, a gate to source zener Z4 is used to prevent gate to source punch through. The dynamic impedance (1/gm) of the regulator is very low since the transconductance of FET1 is nearly one mho.

The second FET circuit uses a linear feed-back FET amplifier to set its reference voltage. A source zener Z21 is used to establish its reference. The output impedance of the regulator circuit formed with the second FET is somewhat greater than that of the first FET since the dynamic impedance of the reference zener diode Z22 is added. The oscilloscope 100 may be a commercially-available Tektronix model, as described above in the description of FIG. 1.

The circuit shown in FIG. 2 can also be used as a pulse clamp regulator. This is done by omitting sense resistor Rs in the ground return of the regulator circuit formed by the second FET, and using a pulse capacitor in place thereof. This aspect of the invention is discussed below in conjunction with the description of FIG. 4.

Figure 3:
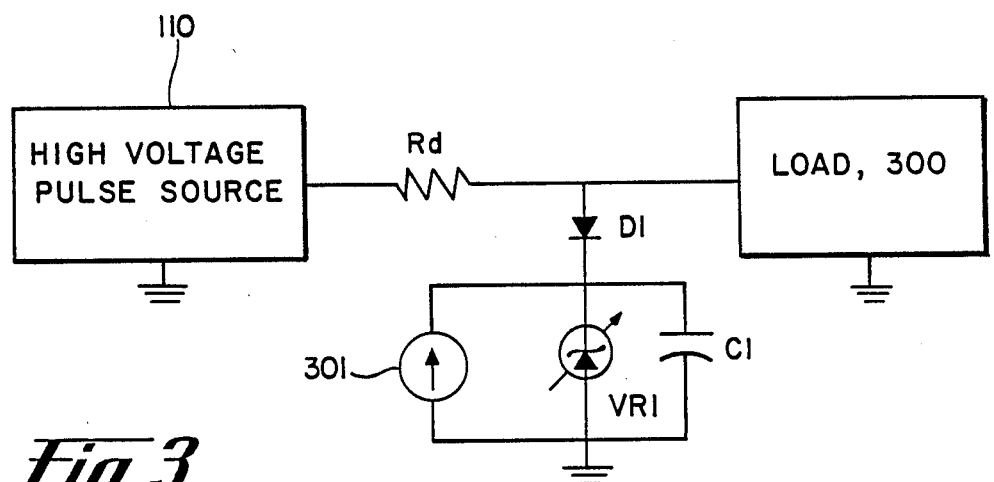
FIG. 3 is an electrical schematic of an embodiment of the invention used a pulse regulator using variable zener diodes.

FIG. 3 is an electrical schematic of an embodiment of the invention used strictly as a pulse regulator which automatically eliminates the perturbations from the top of high voltage square wave pulses received from a transmitter modulator signal source 110. This pulse regulator outputs a regulated square wave pulse to a typical load, such as the travelling wave tube 300 of a radar transmitter, using; an input resistor Rd, a rectifying diode D1, a variable zener diode VR1, a pulse capacitor C1, and a biasing current source 301.

The input resistor Rd electrically connects the transmitter modulator to the rectifying diode D1, which outputs a rectified square wave pulse to: the variable zener diode D1, biasing current source 301, and pulse capacitor C1, which are connected together in parallel. The variable zener diode VR1 is reverse biased with respect to this rectified square wave pulse, and establishes a variable threshold when supplied with the variable biasing current from the current source 301 in much the same manner as discussed in FIG. 1. The pulse capacitor C1 shunts the regulator to reduce the high peak pulse clipping current into a low average value. This has the effect of eliminating the perturbations on top of the square wave so that the regulator outputs a regulated square wave to the load 300. Putting the pulse capacitor in parallel with the regulator circuit has the effect of an R-C filter such that the value of the capacitor is selected to admit the square wave pulse, but filter out the perturbation signal on top of the pulse. An example of the value of C1 was presented earlier in the discussion of FIG. 1. This value for C1 is one microfarad. In FIG. 3, Rd equals 100 ohms. In this configuration, the pulse capacitor C1 interacts with the impedance of the rest of the regulator circuit to form on R-C filter which reduces the voltage perturbations of the high voltage square wave pulse as it is conducted to the load 300.

Figure 4:
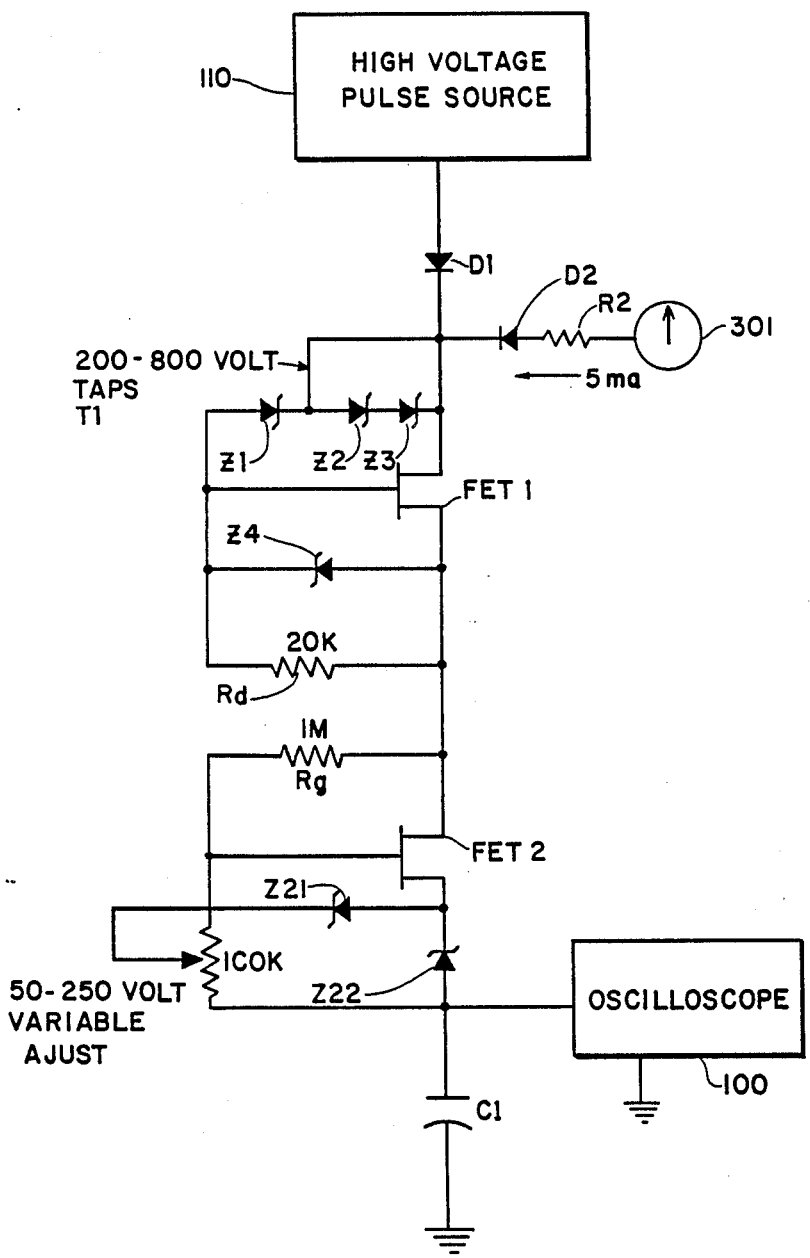
FIG. 4 is an electrical schematic of the system of FIG. 2 modified for use as a pulse clamping devices as well as a pulse measuring device.

FIG. 4 is an electrical schematic of the system of FIG. 2 which is modified for use as a pulse clamping device as well as a pulse measuring device. The system of FIG. 4 includes a pulse capacitor C1 in place of the sense resistor Rs shown in FIG. 12. In this configuration, the pulse capacitor will shunt the regulator to reduce the high peak pulse clipping current into a low average value that the shunt regulator can handle. To be effective, the combined dynamic impedance of the regulator-capacitor and diode combination must be low in comparison to voltage dropping resistor Rd. For a tenth of one percent regulation the ration must be 1:1000. The use of the pulse capacitor in this fashion clamps the perturbations on the top of the square wave. Like the system of FIG. 1, the value of the capacitor is selected based upon the frequency of the pulse and the perturbation signal on top of the pulse. This is better understood in conjunction with the description of FIG. 3, as discussed above. As mentioned in FIG. 3, an example of the invention uses a one microfarad capacitor for the pulse capacitor C1. In this configuration, the pulse capacitor interacts with the impedance of the rest of the circuit to form an R-C filter to reduce the voltage perturbations of the high voltage square wave pulse that would otherwise appear in the regulated detection signal received by the oscilloscope. The use of R-C filters is believed to be understood as described in such standard texts as "Basic Circuit Theory" by C. A. Desser et al, published by the McGraw-Hill Book Company in 1969, the disclosure of which is incorporated by reference.

The present invention forms a basis of greatly improving the pulse instrumentation of transmitter modulators. The apparatus is particularly useful for measuring pulse-to-pulse voltage variations and pulse flatness as required by synthetic aperture radar systems.

The precision pulse clamp regulator provides a means of refining the modulator pulse structure directly at the transmitter tube. In addition to providing the means of operating transmitter tubes in parallel, the clamp regulator eliminates transient ringing voltages that develop between the modulator and the tube control element. As described above, it appears that all of the objects of the present invention have been satisfied.

This invention provides a means of measuring voltage perturbations on the top of transmitter modulator high voltage (0.1 to 30 KV) pulses. The circuit is capable of viewing voltage variations more than one hundred dB down from the pulse height. Moreover, the circuit can be configured as a fast response clipper regulator for transmitter modulators.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. A precision high voltage field effect transistor pulse sense and clamp apparatus for measuring and viewing a high voltage square wave pulse produced by a high voltage pulse sense, said precision high voltage field effect transistor pulse sense and clamp apparatus comprising:

a rectifying diode which receives and rectifies said high voltage square wave pulse from said high voltage pulse source to produce a rectified square wave pulse;

a tapped shunt regulator circuit which is electrically connected with said rectifying diode and which receives said rectified square wave pulse therefrom, said tapped shunt regulator circuit outputting a detection signal by regulating the square wave pulse's voltage amplitude;

an oscilloscope which measures and displays pulses which have voltage levels within its threshold of detection said threshold of detection including a minimum voltage threshold level which said pulses received by said oscilloscope must reach in order for said oscilloscope to measure and display them; and a variable shunt regulator threshold circuit which is electrically connected with said tapped shunt regulator circuit and which receives said detection signal therefrom, said variable shunt regulator threshold circuit outputting to said oscilloscope a regulated detection signal which represents said high voltage wave pulse and which has a voltage amplitude within said threshold of detection of said oscilloscope to permit the measuring and viewing of said high voltage square wave by said oscilloscope.

2. A precision high voltage field effect transistor pulse sense and clamp apparatus, as defined in claim 1, wherein said tapped shunt regulator circuit comprises:

a biasing circuit which produces a biasing current;

a first transistor which has a drain terminal which is connected to said biasing circuit and to said rectifying diode to receive electrical signals therefrom including said biasing current and said rectified square wave pulse, said first transistor having a gate terminal, which receives a gate signal, and said first transistor having a source terminal which outputs said detection signal to said tapped shunt regulator circuit;

a voltage tap circuit which is electrically connected with said rectifying diode and said biasing circuit between said source terminal and said gate terminal of said first transistor, said voltage tap circuit providing a variable reference voltage for said first transistor between said source terminal and said gate terminal; and a gate feedback circuit which is electrically connected between said source terminal and said gate terminal of said first transistor circuit to prevent gate-to-source punch through.

3. A precision high voltage field effect transistor pulse sense and clamp apparatus, as defined in claim 2, wherein said voltage tap circuit comprises:

first, second and third zener diodes which are electrically connected in a series circuit between said drain terminal and said gate terminal of said first transistor; and a voltage tap which electrically connects said biasing circuit and said rectifying diode at any node between said drain terminal, said first, second, and third zener diodes, and said gate terminal to provide said variable reference voltage thereby.

4. A precision high voltage effect transistor pulse sense and clamp apparatus, as defined in claim 2, wherein said variable shunt regulator threshold circuit comprises:

a second transistor which has a drain terminal which receives said detection signal from said tapped shunt regulator circuit, said second transistor having a gate terminal which receives a gate signal, and said second transistor having a source terminal which outputs an amplified detection signal;

a gate resistor which electrically connects said second transistor's gate and drain terminals to provide said gate signal; and a variable adjustment circuit which receives and adjusts said amplified detection signal from said second transistor to a level within the threshold of detection of said oscilloscope, said variable adjustment circuit thereby producing said regulated detection signal.

5. A precision high voltage field effect transistor pulse sense and clamp apparatus, as defined in claim 4, wherein said variable adjustment circuit comprises:

a first zener diode which is forward biased with said source terminal of said second transistor and which receives said amplified detection signal therefrom;

a potentiometer which is electrically connected between said first zener diode and said oscilloscope with a variable impedance to adjust said amplified detection signal within the level of detection of the oscilloscope and thereby produce said regulated detection signal;

a second zener diode which is electrically connected between said potentiometer and said source terminal of said second transistor, said second zener diode being reverse biased with respect to said source terminal of said second transistor; and a sense resistor which electrically connects said second zener diode and said potentiometer to a common electrical ground.

6. A precision high voltage field effect transistor pulse sense and clamp apparatus, as defined in claim 4, where in said variable adjustment circuit comprises:

a first zener diode which is forward biased with said source terminal of said second transistor and which receives said amplified detection signal therefrom;

a potentiometer which is electrically connected between said first zener diode and said oscilloscope with a variable impedance to adjust said amplified detection signal within the level of detection of the oscilloscope and thereby produce said regulated detection signal a second zener diode which is electrically connected between said potentiometer and said source terminal of said second transistor, said second zener diode being reverse biased with respect to said source terminal of said second transistor; and a pulse capacitor which electrically connects said second zener diode and said potentiometer to a common electrical ground to form a filter which reduces voltage perturbations of said high voltage square wave pulse which would otherwise appear in said regulated detection signal.

* * * * *

UNITED STATES PATENT AND TRADEMARK OFFICE
CERTIFICATE OF CORRECTION

PATENT NO. : 4,939,450
DATED : 3 July 1990
INVENTOR(S) : Walter E. Milberger

It is certified that error appears in the above-identified patent and that said Letters Patent is hereby corrected as shown below:

In the Title on Page 1, the title should read -- PRECISION HIGH VOLTAGE FET PULSE SENSE AND CLAMP APPARATUS -- and should not include "STATEMENT OF GOVERNMENT INTEREST".

In column 1 of the specification, the title "PRECISION HIGH VOLTAGE FET PULSE SENSE AND CLAMP APPARATUS" should be separated from "STATEMENT OF GOVERNMENT INTEREST".

Signed and Sealed this

Sixth Day of November, 1990

*Attest:*

HARRY F. MANBECK, JR.

*Attesting Officer*      *Commissioner of Patents and Trademarks*